United States Patent
Lhee et al.

(10) Patent No.: US 9,484,556 B2
(45) Date of Patent: Nov. 1, 2016

(54) METHOD OF REPAIRING ORGANIC LIGHT-EMITTING DISPLAY APPARATUS

(71) Applicant: Samsung Display Co., Ltd., Yongin, Gyeonggi-Do (KR)

(72) Inventors: Zail Lhee, Yongin (KR); Huiyeon Choe, Yongin (KR); Hyori Jeon, Yongin (KR); Younggil Park, Yongin (KR)

(73) Assignee: Samsung Display Co., Ltd. (KR)

( * ) Notice: Subject to any disclaimer, the term of this patent is extended or adjusted under 35 U.S.C. 154(b) by 9 days.

(21) Appl. No.: 14/242,665

(22) Filed: Apr. 1, 2014

(65) Prior Publication Data
US 2015/0064807 A1 Mar. 5, 2015

(30) Foreign Application Priority Data
Aug. 28, 2013 (KR) .......................... 10-2013-0102655

(51) Int. Cl.
| | |
|---|---|
| H01B 13/00 | (2006.01) |
| C03C 25/68 | (2006.01) |
| H01J 37/305 | (2006.01) |
| H01L 51/56 | (2006.01) |
| C23F 1/08 | (2006.01) |
| B05C 11/00 | (2006.01) |
| H01L 27/32 | (2006.01) |

(52) U.S. Cl.
CPC .......... H01L 51/56 (2013.01); H01L 27/3276 (2013.01); *H01L 2251/568* (2013.01)

(58) Field of Classification Search
CPC ................... H01L 21/02079; H01L 21/31116; H01L 21/31604; H01L 21/32136; H01L 21/76892
USPC ......................... 250/309, 396; 324/750, 751
See application file for complete search history.

(56) References Cited

U.S. PATENT DOCUMENTS

| | | | | |
|---|---|---|---|---|
| 5,578,821 | A | * | 11/1996 | Meisberger et al. .......... 250/310 |
| 5,844,416 | A | * | 12/1998 | Campbell et al. ........ 324/754.21 |
| 2008/0006603 | A1 | * | 1/2008 | Williamson et al. ........... 216/13 |
| 2009/0262049 | A1 | | 10/2009 | Yoon et al. |
| 2011/0210335 | A1 | * | 9/2011 | Miyagi ................ G09G 3/3233 257/59 |
| 2012/0146004 | A1 | * | 6/2012 | Lee et al. ........................ 257/40 |

FOREIGN PATENT DOCUMENTS

| | | |
|---|---|---|
| KR | 10-2004-0001276 A | 1/2004 |
| KR | 10-0782985 B1 | 12/2007 |
| KR | 10-2009-0109928 | 10/2009 |

* cited by examiner

*Primary Examiner* — Kimberly Rizkallah
*Assistant Examiner* — Brian Turner
(74) *Attorney, Agent, or Firm* — Innovation Counsel LLP

(57) ABSTRACT

A method of repairing an organic light-emitting display apparatus, the organic light-emitting display apparatus including a substrate, an organic light-emitting device formed on the substrate, a thin film transistor (TFT) formed on the substrate, an organic insulating layer formed on the TFT, and a conductive pattern formed on the organic insulating layer, the conductive pattern including a shorted part between two conductive elements in the conductive pattern, the method including: removing the short by using a focused ion beam (FIB).

16 Claims, 6 Drawing Sheets

METHOD OF REPAIRING ORGANIC LIGHT-EMITTING DISPLAY APPARATUS

RELATED APPLICATION

This application claims the benefit of Korean Patent Application No. 10-2013-0102655, filed on Aug. 28, 2013, in the Korean Intellectual Property Office, the disclosure of which is incorporated herein in its entirety by reference.

BACKGROUND

1. Field

One or more embodiments of the present invention relate to a method of repairing an organic light-emitting display apparatus.

2. Description of the Related Art

Recently, display apparatuses are being replaced with flat panel display apparatuses that are thin and portable. Among the flat panel display apparatuses, organic light emitting display apparatuses have a wide viewing angle, excellent contrast, and a high response speed. Thus, organic light emitting display apparatuses are being noticed as next-generation display apparatuses.

An organic light emitting display apparatus includes a plurality of thin film transistors (TFT). An organic layer may be formed on each of the TFTs. Wires and electrodes may be formed on the emission layer. The organic layer may, however, be easily damaged as compared to an inorganic layer, and thus when shorts or disconnections occur between wires and electrodes, organic light emitting display apparatuses are difficult to repair.

SUMMARY

A method of repairing an organic light-emitting display apparatus by which a lower organic layer is less damaged is provided.

Additional aspects will be set forth in part in the description which follows and, in part, will be apparent from the description.

A method of repairing an organic light-emitting display apparatus, the organic light-emitting apparatus including a substrate, an organic light-emitting device formed on the substrate, a thin film transistor (TFT) formed on the substrate, an organic insulating layer formed on the TFT, and a conductive pattern formed on the organic insulating layer, the conductive pattern including a shorted part between two conductive elements in the conductive pattern, the method including: removing the short by using a focused ion beam (FIB).

The removing of the short may include: etching the shorted part by radiating an ion beam to a location where the shorted part occurs.

The removing of the short may include: supplying a fluorine containing gas to the location where the shorted part occurs.

The fluorine containing gas may include Xenon difluoride ($XeF_2$).

The removing of the short may include: applying a charge neutralizer to the location where the shorted part occurs.

The removing of the short may include: applying a charge remover to the location where the shorted part occurs, wherein the charge remover includes: a contact unit in which an opening is formed; and a charge moving unit connected to the contact unit.

The contact unit may include a first electrode unit and a second electrode unit that are insulated from each other by an insulating unit, and wherein the charge moving unit is connected to the first electrode unit or the second electrode unit.

The organic light-emitting device may include a first electrode, a second electrode, and an organic emission layer disposed between the first electrode and the second electrode, and wherein the conductive pattern includes a wire pattern and the first electrode.

The first electrode and the wire pattern may be formed of the same metallic material.

The FIB may use gallium as a source.

A method of repairing an organic light-emitting display apparatus, the organic light-emitting apparatus including a substrate, an organic light-emitting device formed on the substrate, a TFT formed on the substrate, an organic insulating layer formed on the TFT, and a conductive pattern formed on the organic insulating layer, the conductive pattern including a disconnection in a conductive element, the method including: repairing the disconnection by using a focused ion beam (FIB).

The repairing of the disconnection may include: radiating a deposition gas to a location where the disconnection occurs; and emitting an ion beam to the location where the disconnection occurs from the FIB.

The repairing of the disconnection may include: supplying a fluorine containing gas to the location where the disconnection occurs.

The fluorine containing gas may include Xenon difluoride ($XeF_2$).

The repairing of the disconnection may include: applying a charge neutralizer to the location where the disconnection occurs.

The repairing of the disconnection may include: applying a charge remover to the location where the disconnection occurs, wherein the charge remover includes: a contact unit in which an opening is formed; and a charge moving unit connected to the contact unit.

The contact unit may include a first electrode unit and a second electrode unit that are insulated from each other by an insulating unit, and wherein the charge moving unit is connected to the first electrode unit or the second electrode unit.

The organic light-emitting device may include a first electrode, a second electrode, and an organic emission layer disposed between the first electrode and the second electrode, and wherein the conductive pattern includes a wire pattern and the first electrode.

The first electrode and the wire pattern may be formed of the same metallic material.

The FIB may use gallium as a source.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
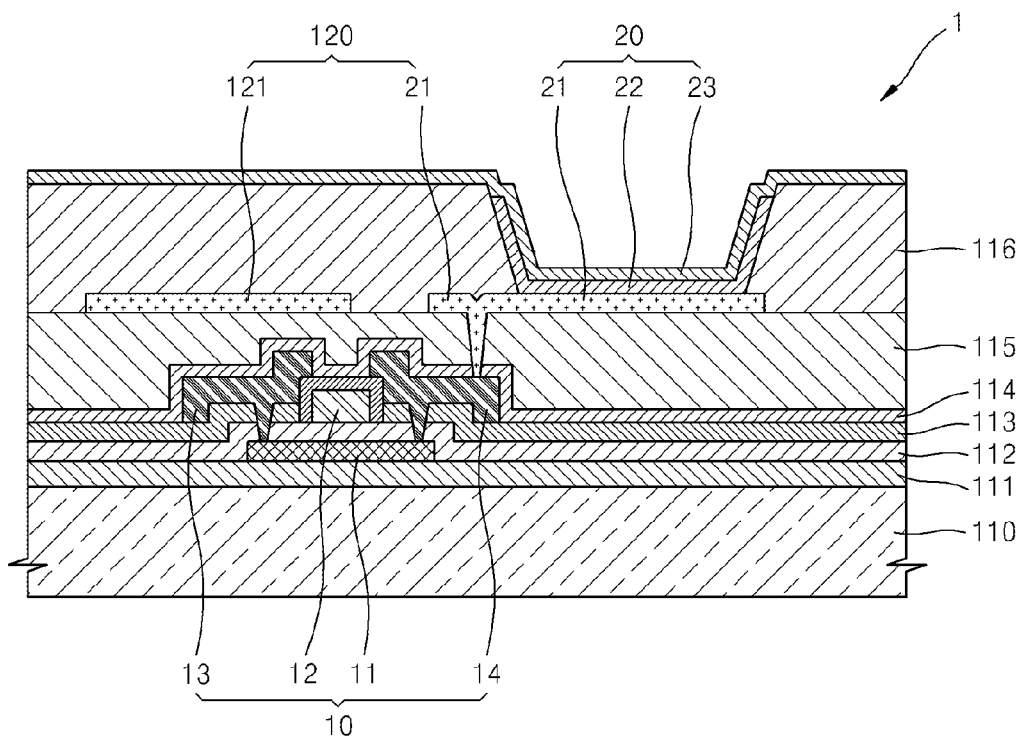
FIG. 1 is a schematic cross-sectional view illustrating an organic light-emitting display apparatus according to an embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Figure 2:
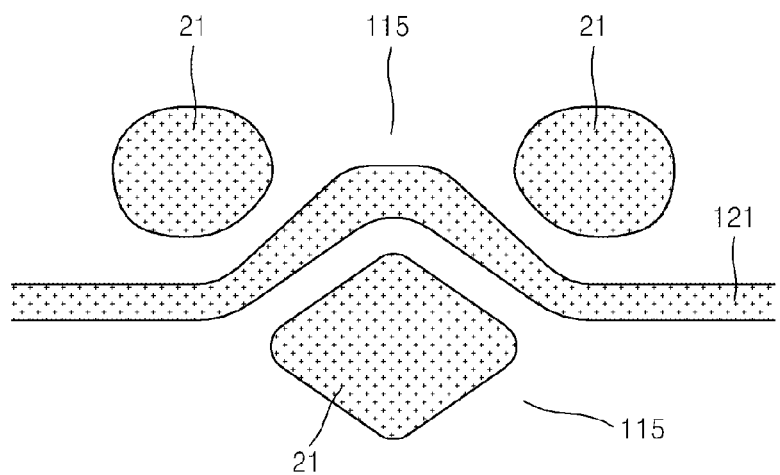
FIG. 2 is a schematic plan view illustrating an organic light-emitting display apparatus according to an embodiment.

FIG. 1 is a schematic cross-sectional view illustrating an organic light-emitting display apparatus 1 according to an embodiment. FIG. 2 is a schematic plan view illustrating the organic light-emitting display apparatus 1 according to an embodiment.

Referring to FIGS. 1 and 2, a conductive pattern 120 may be formed on an organic insulating layer 115 without causing a defect.

Referring to FIG. 1, the organic light-emitting display apparatus 1 according to the present embodiment includes a substrate 110 and an organic light-emitting device 20.

The organic light-emitting device 20 and a thin film transistor (TFT) 10 connected to the organic light-emitting device 20 are provided on the substrate 110. Although one organic light-emitting device 20 and one TFT 10 are shown in FIGS. 1 and 2, this is for convenience of description, and thus the organic light-emitting display apparatus 1 according to the present embodiment may include a plurality of organic light-emitting devices 20 and a plurality of TFTs 10.

Organic light emitting display apparatuses may be classified into either a passive matrix (PM) type or an active matrix (AM) type based on the driving method of the organic light-emitting devices 20 by the TFTs 10. The method of the embodiments of the present disclosure may be used with organic light emitting display apparatuses of both of the PM and AM types. An AM type organic light-emitting display apparatus according to an embodiment will be described in detail below.

A buffer layer 111 that is formed of $SiO_2$ and/or $SiN_x$ may be provided on the substrate 110 to provide smoothness to the substrate 110 and to prevent impure elements from penetrating into the substrate 110.

An active layer 11 of the TFT 10 is formed of a semiconductor material and on the buffer layer 111. The active layer 11 may be formed of polycrystalline silicone but is not necessarily limited and may be formed of an oxide semiconductor. For example, the oxide semiconductor may include an oxide formed of a material selected from the group consisting of 12, 13, and 14 Group metal elements such as zinc (Zn), indium (In), gallium (Ga), tin (Sn), cadmium (Cd), germanium (Ge), hafnium (Hf), and a combination of these. For example, the active layer 11 may include G-I—Z—O[$(In_2O_3)a(Ga_2O_3)b(ZnO)c$] (a, b, and c are real numbers that satisfy conditions of a≥0, b≥0, and c>0).

A gate insulating layer 112 is formed to cover the active layer 11. A gate electrode 12 is provided on the gate insulating layer 112. An interlayer insulating layer 113 is formed so as to cover the gate electrode 12. A source electrode 13 and a drain electrode 14 are provided on the interlayer insulating layer 113. A passivation layer 114 and an organic insulating layer 115 are sequentially provided so as to cover the source electrode 13 and the drain electrode 14.

The gate insulating layer 112, the interlayer insulating layer 113, and the passivation layer 114 may be insulators, and may be formed in a single-layer structure or a multiple layer structure, and may include inorganic materials, organic materials, and organic/inorganic compounds.

The organic insulating layer 115 may be formed so as to cover the TFT 10. The organic insulating layer 115, which is used to reduce a step difference of the substrate 110 including a plurality of TFTs 10, may be an insulating layer having a planar top surface and a single-layer structure or a multiple layer structure. One or more materials selected from the group including, for example, polyimide, polyamide, acrylic resin, benzocyclobutene, and phenolic resin may be used as the organic insulating layer 115.

The above-described stack structure of the TFT 10 is merely an example, and other various other structures and materials thereof may be used to form the TFT 10.

A first electrode 21 that is an anode electrode of the organic light-emitting device 20 is formed on the organic insulating layer 115. A pixel defining layer 116 that is formed of an insulating material is formed so to cover a portion of the first electrode 21. An opening is formed in the pixel defining layer 116 exposing a portion of the first electrode 21, and then an organic emission layer 22 of the organic light-emitting device 20 is formed in a region limited to the opening. A second electrode 23 that is a cathode electrode of the organic light-emitting device 20 is formed to cover the entire pixel area. Polarities of the first electrode 21 and the second electrode 23 may be switched.

Holes and electrons are injected into the organic emission layer 22 from the first electrode 21 and the second electrode 23, respectively. Light emits when an exciton that is a mixture of the injected holes and electrons is changed from an excitation status to a base status.

The organic emission layer 22 may be formed of a low-molecular weight or a polymer organic layer. When the organic emission layer 22 is formed of a low-molecular weight layer, the organic emission layer 22 may have a single-layer or multiple layer structure in which a hole injection layer (HIL) (not shown), a hole convey layer (HTL) (not shown), an electron convey layer (ETL) (not shown), and an electron injection layer (EIL) (not shown) are stacked, in addition to an emissive layer (EML), and may use various organic materials such as copper phthalocyanine (CuPc), N,N'-Di(naphthalene-1-yl)-N,N'-diphenyl-benzidine (NPB), tris-8-hydroxyquinoline aluminum (Alq3), etc. The low-molecular weight organic layers may be formed by using vacuum deposition.

When the organic emission layer 22 is formed of a polymer organic layer, the organic emission layer 22 may have a structure further including the HTL (not shown) and the EML (not shown) toward the anode electrode. In this regard, Poly(3,4-ethylenedioxythiophene) (PEDOT) may be used as the HTL, and a polymer organic material such as poly-phenylenevinylene based material or a polyfluorene based material is used as the EML.

The organic emission layer 22 may be formed in the opening and is formed of an additional emission material in each pixel but is not necessarily limited thereto. The organic emission layer 22 may alternatively be formed commonly over the entire pixel area of the plurality of pixel areas in a display irrespective of locations of the individual pixels. In this regard, the organic emission layer 22 may be formed by vertically stacking or mixing layers including emission materials that emit, for example, red, green, and blue light. If white light is emitted, a combination of other colors is also possible. A color conversion layer or a color filter that converts the emitted white light into a color may be further included.

The organic light-emitting device 20 of the organic light-emitting display apparatus 1 according to an embodiment may emit light in a direction toward an encapsulation layer or substrate (not shown) positioned over the display apparatus 1 opposite the substrate 110. That is, the organic light-emitting device 20 may be a top emission type. In this regard, to emit light in the direction toward the encapsulation layer, a reflective electrode is used as the first electrode 21, and a transmissive or semi-transmissive electrode is used as the second electrode 23. However, the organic light-emitting display apparatus 1 is not limited to the top emission type according to an embodiment. Thus, the organic light-emitting display apparatus 1 may be a back emission type or both a top and back emission type.

A thin film encapsulation layer (not shown) may be disposed on the organic light-emitting device 20 to protect the organic light-emitting device 20 and a driving circuit unit. The thin film encapsulation layer may be formed by alternately stacking one or more organic layers and one or more inorganic layers. A plurality of organic layers and a plurality of inorganic layers may be used.

An encapsulation substrate (not shown) that encapsulates the organic light-emitting device 20 may be disposed on the substrate 110 including the organic light-emitting device 20 to face the substrate 110. The encapsulation substrate may be formed of glass, metal, or plastic.

Referring to FIGS. 1 and 2, the conductive pattern 120 may be formed on the planar top surface of the organic insulating layer 115. The conductive pattern 120 may include conductive elements, including for example a wire pattern 121 and the first electrode 21. The wire pattern 121 and the first electrode 21 may be formed of the same material during the same process. The wire pattern 121 may be formed to pass through the plurality of first electrodes 21.

Figure 3:
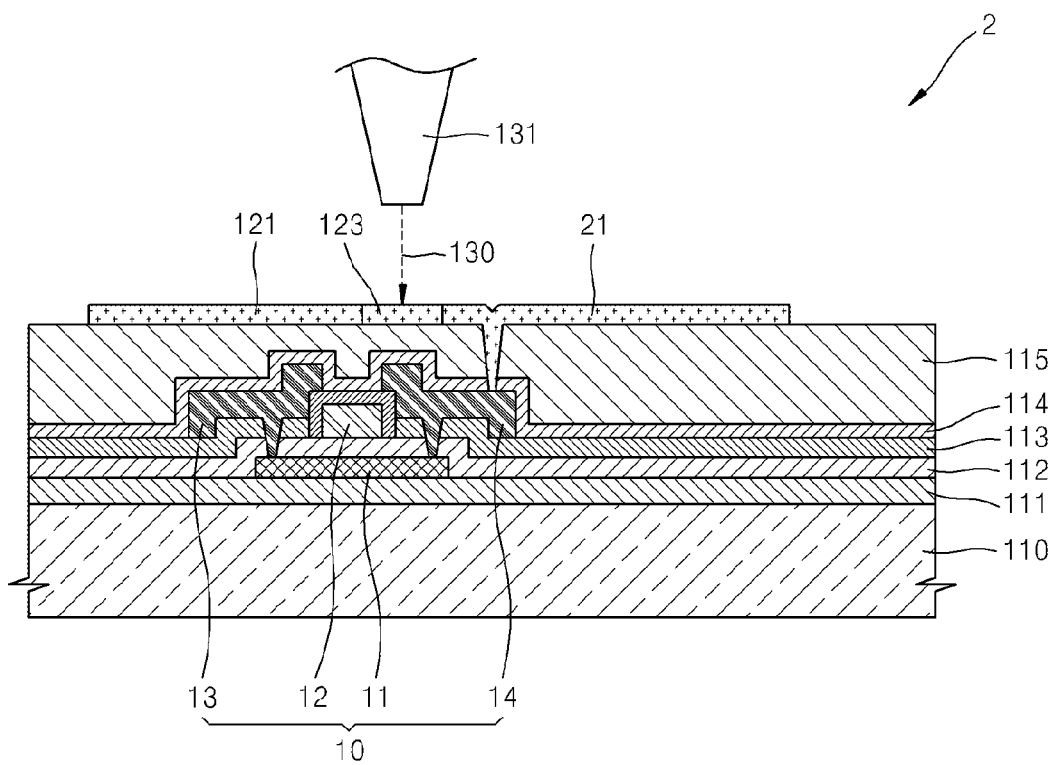
FIG. 3 is a schematic cross-sectional view illustrating a part of an organic light-emitting display apparatus in which a short occurs according to an embodiment.
Figure 4:
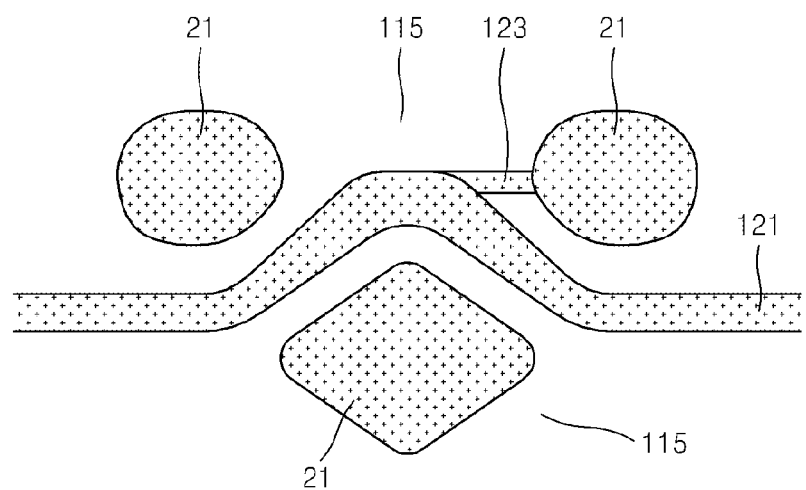
FIG. 4 is a schematic plan view illustrating a part of an organic light-emitting display apparatus in which a short occurs according to an embodiment.

FIG. 3 is a schematic cross-sectional view illustrating a part of an organic light-emitting display apparatus 2 in which a short occurs according to an embodiment. FIG. 4 is a schematic plan view illustrating the part of the organic light-emitting display apparatus 2 in which the short occurs according to an embodiment.

Referring to FIGS. 3 and 4, the short may occur between conductive elements in the conductive pattern 120, for example, the short may occur between the wire pattern 121 disposed on the organic insulating layer 115 and the first electrode 21. When such a short occurs, a shorted part 123 that causes the short may be cut to remove the short.

A focused ion beam (FIB) 130 may be used to cut the shorted part 123. The short may be removed by cutting the shorted part 123 by using the FIB 130. The FIB 130 may be radiated by using a FIB radiation apparatus 131. The FIB 130 may use, for example, gallium Ga as a source. The FIB 130 is used to cut the shorted part 123, thereby removing the short while reducing damage that may occur in the organic insulating layer 115 disposed beneath the shorted part 123 when removing the short.

Although the short between the wire pattern 121 and the first electrode 21 is shown in FIGS. 3 and 4, the short is not limited thereto. The above method may be applied to any shorts that occur between conductive elements in a conductive pattern disposed on the organic insulating layer 115.

Figure 5:
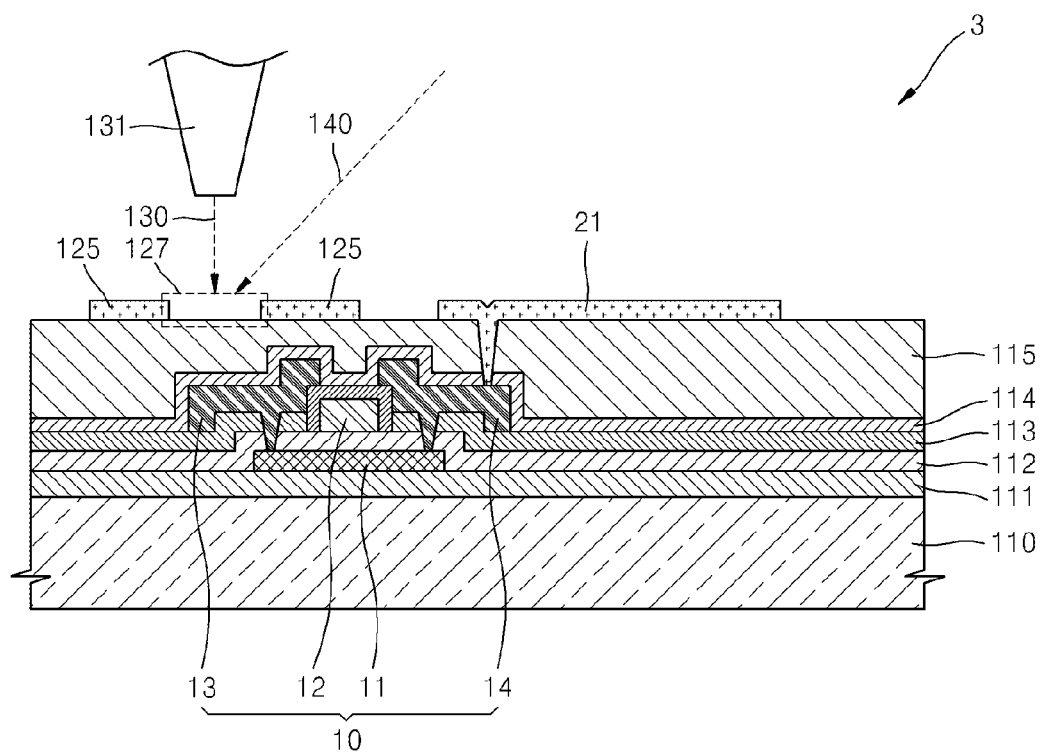
FIG. 5 is a schematic cross-sectional view illustrating a part of an organic light-emitting display apparatus in which a disconnection occurs according to an embodiment.
Figure 6:
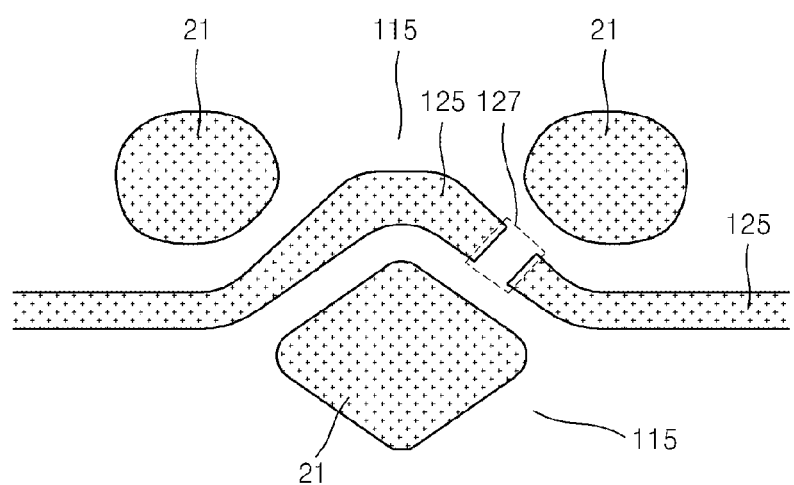
FIG. 6 is a schematic plan view illustrating a part of an organic light-emitting display apparatus in which a disconnection occurs according to an embodiment.

FIG. 5 is a schematic cross-sectional view illustrating a part of an organic light-emitting display apparatus 3 in which a disconnection occurs according to an embodiment. FIG. 6 is a schematic plan view illustrating the part of the organic light-emitting display apparatus 3 in which the disconnection occurs according to an embodiment.

Referring to FIGS. 5 and 6, the disconnection may occur between the wire pattern 121 disposed on the organic insulating layer 115. When such a disconnection occurs, the disconnection may be repaired by forming a conductive material on the organic insulating layer 115 at the disconnect location 127.

The FIB 130 may be used to form the conductive material on the organic insulating layer 115 at the disconnect location 127. The FIB 130 and a deposition gas 14 are simultaneously radiated to the disconnect location 127, thereby depositing the conductive material on the disconnected location 127 while also dissolving the deposition gas 140 by using the FIB 130. The FIB 130 may be radiated by using the FIB radiation apparatus 131. The FIB 130 may use, for example, gallium Ga as a source. The FIB 130 is used to form the conductive material on the organic insulating layer 115 at the disconnect location 127, thereby reducing damage that may occur in the organic insulating layer 115 disposed beneath the disconnect part 127 when repairing the disconnection, and also increasing a bonding force between the deposited conductive material and the organic insulating layer 115.

Although the disconnection of the wire pattern 121 is shown in FIGS. 5 and 6, the short is not limited thereto. The above method may be applied to any disconnections that occur in a conductive layer 120 on the organic insulating layer 115.

Figure 7:
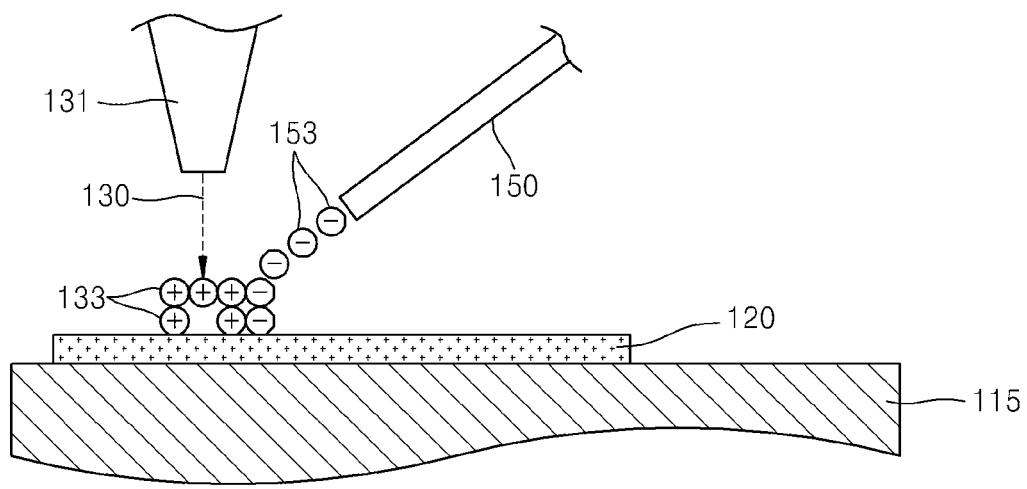
FIG. 7 is a schematic view illustrating a case where a charge neutralizer is applied.

FIG. 7 is a schematic view illustrating a case where a charge neutralizer 150 is applied.

Charges 133 may collect around the beam of the FIB 130 when the FIB 130 is applied in a process of repairing the organic light-emitting display apparatuses 2 and 3. The charges 133 are gathered around the area including the TFT 10, and may damage the TFT 10 or change the characteristics of the TFT 10.

Referring to FIG. 7, a charge neutralizer 150 may be applied to a location where the FIB 130 is radiated. Charges 153 discharged by the charge neutralizer 150 are combined with the charges 133 collected around the beam of the FIB 130, and thus the charges 133 may be neutralized. In this regard, the charges 133 may be positive charges, and the charges 153 discharged by the charge neutralizer 150 may be negative charges. The charges 133 collected around the beam of the FIB 130 are neutralized, thereby preventing damage to the device around the location where the FIB 130 is radiated, or a change in the characteristics of the device.

Figure 8:
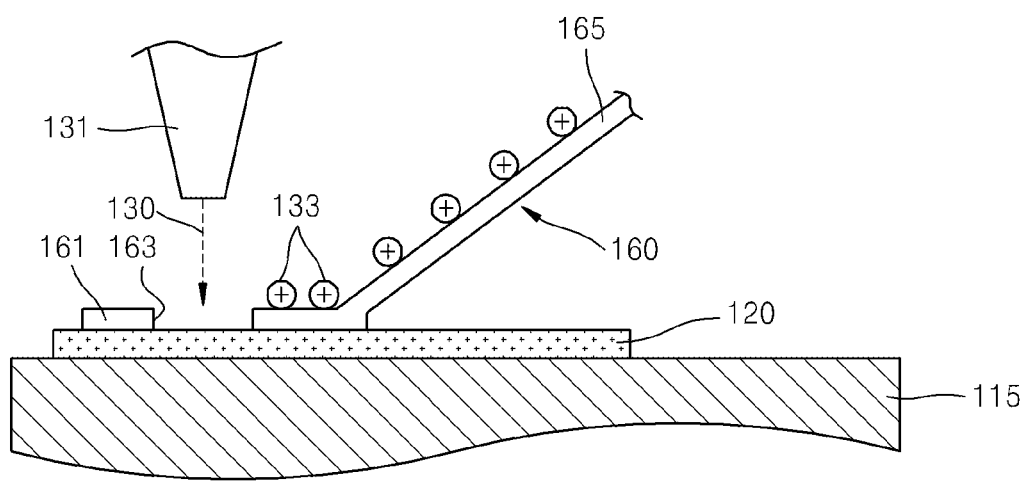
FIG. 8 is a schematic view illustrating a case where a charge remover is applied.
Figure 9A:
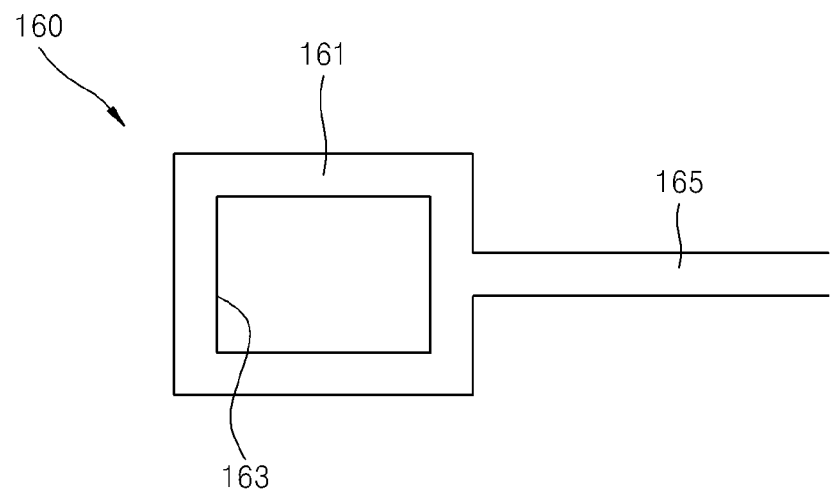
FIG. 9A is a schematic plan view illustrating a charge remover according to an embodiment.
Figure 9B:
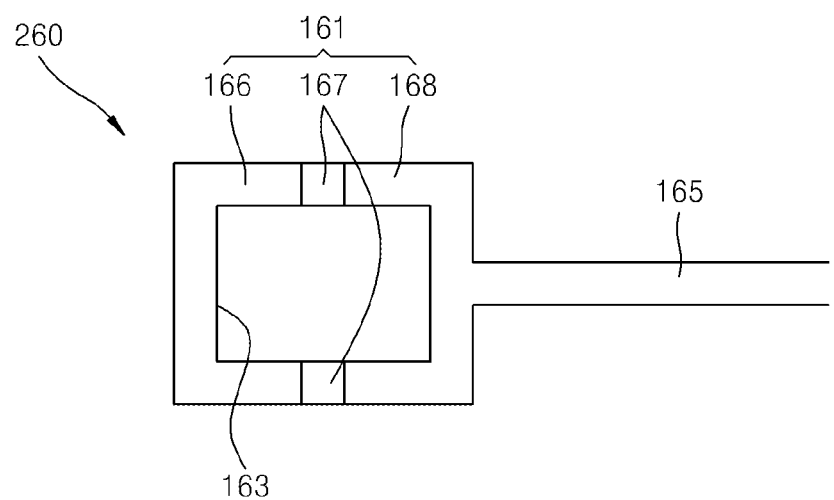
FIG. 9B is a schematic plan view illustrating a charge remover according to another embodiment.

FIG. 8 is a schematic view illustrating a case where a charge remover 160 is applied. FIG. 9A is a schematic plan view illustrating the charge remover 160 according to an embodiment. FIG. 9B is a schematic plan view illustrating a charge remover 260 according to another embodiment.

Referring to FIG. 8, the charges 133 that collect around the beam of the FIB 130 may be removed from a location where the FIB 130 is radiated by applying the charge remover 160 onto the conductive pattern 120.

Referring to FIGS. 8 and 9A, the charge remover 160 is formed as a conductor and includes a contact unit 161 and a charge moving unit 165. An opening 163 is formed in the contact unit 161. The contact unit 161 contacts the conductive pattern 120 and is disposed such that the opening 163 is disposed in a region to which the FIB 130 is radiated, that is, the FIB is radiated through the opening 163. The charges 133 move toward and into the contact unit 161, and then are discharged to the outside along the charge moving unit 165. The charges 133 that collect around the beam of the FIB 130 are discharged by using the charge moving unit 165, thereby preventing damage to the device around the location to which the FIB 130 is radiated or a change in the characteristics of the device.

Referring to FIG. 9A, the charge remover 160 according to an embodiment may be formed of an integrated metal material. When the charges 133 that collect around the beam of the FIB 130 are positive charges, in the charge moving unit 165, an electric potential may be slowly reduced in a direction far from the opening 163 such that the charges 133 may be efficiently discharged to the outside.

Referring to FIG. 9B, the charge remover 260 according to another embodiment includes the contact unit 161 and the charge moving unit 165. The contact unit 161 may include a first electrode unit 166, a second electrode unit 168, and an insulating unit 167. The first electrode unit 166 and the second electrode unit 168 are insulated from each other by the insulating unit 167. The charge moving unit 165 is connected to the first electrode unit 166 or the second electrode unit 168. When the charges 133 collected by the FIB 130 are positive charges, the second electrode unit 168 may be connected to the charge moving unit 165, the first electrode unit 166 may be used as a (+) electrode, and the second electrode unit 168 and the charge moving unit 165 may be used as (−) electrodes, and in the charge moving unit 165, an electric potential may be slowly reduced in a direction far from the opening 163. In this case, the charges 133 that collect around the beam of the FIB 130 first move to the second electrode 168 for the most part, and then secondly move in the direction away from the opening 163 along the charge moving unit 165, and thus the charges 133 may be efficiently discharged to the exterior of the device.

Although not shown, when a metal layer is further formed on the conductive pattern 120, the charges 133 that collect around the beam of the FIB 130 may be discharged by applying a voltage to the metal layer.

Figure 10:
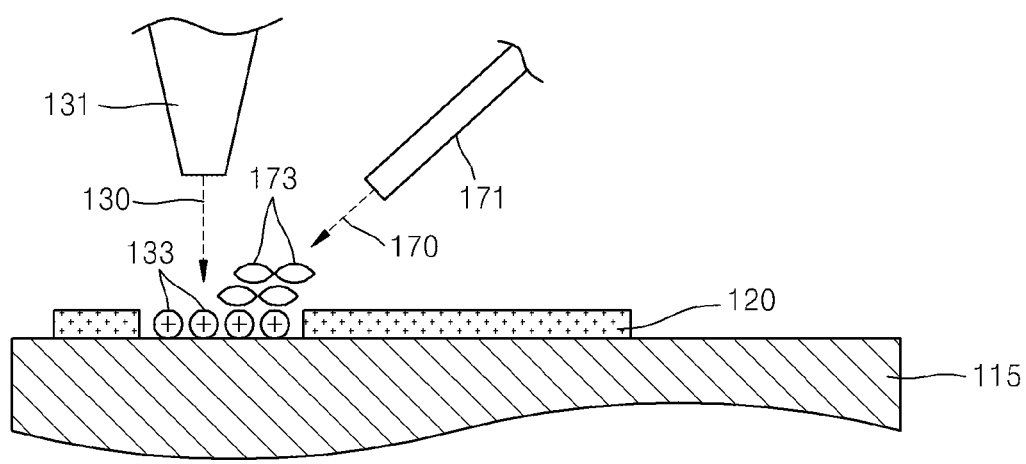
FIG. 10 is a schematic view for explaining a case where a fluorine containing gas is supplied.

FIG. 10 is a schematic view illustrating a case where a fluorine containing gas 170 is supplied.

Referring to FIG. 10, when the FIB 130 is applied to a process of repairing the organic light-emitting display apparatuses 2 and 3, a short may occur on the conductive pattern 120 as a result of the charges 133 that collect around the beam of the FIB 130.

When the charges 133 are positive charges, the fluorine containing gas 170 may be supplied to a location to which the FIB 130 is radiated. The fluorine containing gas 170 may be supplied by a fluorine containing gas radiation apparatus 171. Fluorine containing molecules 173 in the fluorine containing gas 170 chemically reacts with the charges 133 collected by the FIB 130 so that the charges 133 collected by the FIB 130 are combined with fluorine, and thus a remaining material by the FIB 130 may be removed. The fluorine containing molecules 173 may be, for example, Xenon difluoride ($XeF_2$). The short in the conductive pattern 120 that occurs by the charges 133 collected by the FIB 130 may be prevented by removing the remaining material by the FIB 130. The fluorine containing gas 170 may be supplied after the FIB 130 is radiated. Alternatively, the fluorine containing gas 170 may be supplied simultaneously with the radiation of the FIB 130.

As described above, according to the one or more of the above embodiments of the present disclosure, damage to an organic layer may be reduced when wires and electrodes provided on the organic layer are repaired.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope of the present disclosure, including the following claims.

What is claimed is:

1. A method of repairing an organic light-emitting display apparatus comprising:
    forming a thin film transistor (TFT) on a substrate;
    forming an organic insulating layer on the TFT;
    forming a conductive pattern directly on the organic insulating layer, the conductive pattern including a shorted part between two conductive elements in the conductive pattern; and
    removing the shorted part_by using a focused ion beam (FIB),
    wherein the organic light-emitting display apparatus comprises a first electrode, a second electrode, and an organic emission layer disposed between the first electrode and the second electrode,
    wherein the two conductive elements in the conductive pattern are a wire pattern and the first electrode, and
    wherein the removing of the short comprises: etching the shorted part by radiating the focused ion beam to a location where the shorted part occurs and contacting a charge remover to the conductive pattern on a location where the shorted part occurs.

2. The method of claim 1, wherein the removing of the short comprises: supplying a fluorine containing gas to the location where the shorted part occurs.

3. The method of claim 2, wherein the fluorine containing gas comprises Xenon difluoride ($XeF_2$).

4. The method of claim 1, wherein the removing of the shorted part comprises: applying a charge neutralizer to the location where the shorted part occurs.

5. The method of claim 1,
    wherein the charge remover comprises:
    a contact unit in which an opening is formed; and
    a charge moving unit connected to the contact unit.

6. The method of claim 5,
wherein the contact unit comprises a first electrode unit and a second electrode unit that are insulated from each other by an insulating unit, and
wherein the charge moving unit is connected to the first electrode unit or the second electrode unit.

7. The method of claim 1, wherein the first electrode and the wire pattern are formed of the same metallic material.

8. The method of claim 1, wherein the FIB uses gallium as a source.

9. A method of repairing an organic light-emitting display apparatus comprising:
forming a TFT on a substrate;
forming an organic insulating layer on the TFT;
forming a conductive pattern directly on the organic insulating layer, the conductive pattern including a disconnection in a conductive element; and
repairing the disconnection by using a focused ion beam (FIB),
wherein the organic light-emitting display apparatus comprises a first electrode, a second electrode, and an organic emission layer disposed between the first electrode and the second electrode,
wherein the conductive pattern comprises a wire pattern and the first electrode, and
wherein the repairing of the disconnection comprises:
radiating a deposition gas to a location where the disconnection occurs,
emitting an ion beam to the location where the disconnection occurs from the FIB, and
contacting a charge remover to the conductive pattern on a location where the disconnection occurs.

10. The method of claim 9, wherein the repairing of the disconnection comprises: supplying a fluorine containing gas to the location where the disconnection occurs.

11. The method of claim 10, wherein the fluorine containing gas comprises Xenon difluoride ($XeF_2$).

12. The method of claim 9, wherein the repairing of the disconnection comprises: applying a charge neutralizer to the location where the disconnection occurs.

13. The method of claim 9,
wherein the charge remover comprises:
a contact unit in which an opening is formed; and
a charge moving unit connected to the contact unit.

14. The method of claim 13,
wherein the contact unit comprises a first electrode unit and a second electrode unit that are insulated from each other by an insulating unit, and
wherein the charge moving unit is connected to the first electrode unit or the second electrode unit.

15. The method of claim 9, wherein the first electrode and the wire pattern are formed of the same metallic material.

16. The method of claim 9, wherein the FIB uses gallium as a source.

* * * * *